(12) United States Patent
Nakamura et al.

(10) Patent No.: US 6,281,449 B1
(45) Date of Patent: *Aug. 28, 2001

(54) PRINTED BOARD, MANUFACTURING METHOD THEREFOR AND STRUCTURE FOR CONNECTING CONDUCTOR ELEMENTS TO THE PRINTED BOARD

(75) Inventors: Satoshi Nakamura; Masaharu Tanaka, both of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/142,592

(22) PCT Filed: Jan. 22, 1998

(86) PCT No.: PCT/JP98/00280

§ 371 Date: Sep. 10, 1998

§ 102(e) Date: Sep. 10, 1998

(87) PCT Pub. No.: WO98/33363

PCT Pub. Date: Jul. 30, 1998

(30) Foreign Application Priority Data

Jan. 23, 1997 (JP) .......................................................... 9-10184
May 23, 1997 (JP) ........................................................ 9-133366

(51) Int. Cl.⁷ ..................................................... H01R 9/09
(52) U.S. Cl. .................... 174/261; 174/268; 228/180.21; 361/803; 439/59
(58) Field of Search ..................................... 174/261, 259, 174/252, 268, 94 R, 250, 267; 361/778, 803, 804, 748, 719, 720, 721; 439/95, 100, 59; 228/180.21

(56) References Cited

U.S. PATENT DOCUMENTS

| 3,120,415 | * | 2/1964 | Durocher ........................ 174/261 X |
| 3,529,212 | * | 9/1970 | Ballard ............................. 174/261 X |
| 5,091,826 | * | 2/1992 | Arnett et al. .................... 174/261 X |

FOREIGN PATENT DOCUMENTS

| 62-55878 | 3/1987 | (JP) . |
| 63-55373 | 4/1988 | (JP) . |
| 63-299063 | 12/1988 | (JP) . |

* cited by examiner

*Primary Examiner*—Albert W. Paladini
(74) *Attorney, Agent, or Firm*—Merchant & Gould P.C.

(57) ABSTRACT

A printed board (5) for mounting electronic component, a method for making the same, and an arrangement for connecting a conductive elements (8, 8') to the printed board are provided. The printed board includes an insulating substrate (50), and at least one metal terminal (53, 54). The substrate is formed with at least one opening (51, 52) penetrating the substrate. The metal terminal is fixed to the substrate so as to bridge the opening, without projecting out of the substrate.

6 Claims, 8 Drawing Sheets

PRINTED BOARD, MANUFACTURING METHOD THEREFOR AND STRUCTURE FOR CONNECTING CONDUCTOR ELEMENTS TO THE PRINTED BOARD

TECHNICAL FIELD

The present invention relates to a printed board to be mounted with electronic components, and a method for making the printed board. The present invention also relates to a connecting arrangement of a conductive element to the printed board.

BACKGROUND ART

A printed board 1 shown in FIG. 9 and a printed board 1' shown in FIG. 10 are both publicly well known. The printed board shown in FIG. 9 comprises a substrate 10 made of an insulating material, a predetermined wiring pattern (not illustrated) formed on a surface of the substrate, and a metal terminal 11 made of a thin plate of nickel for example. The metal terminal 11 has end potions 11A, 11B spaced longitudinally from each other. The metal terminal 11 is fixed to the substrate 10 by solder (A) only at the end portion 11A. The end portion 11B is not directly supported by the substrate 10.

Likewise, the printed board 1' shown in FIG. 10 comprises a substrate 10' made of an insulating material, a predetermined wiring pattern (not illustrated) formed on a surface of the substrate, and a metal terminal 11' made of a thin plate of nickel for example. Differing from the metal terminal 11 in FIG. 9, the metal terminal 11' in FIG. 10 has its entire back face fixed to the substrate 10' by solder (A').

Each of the metal terminals 11, 11' is attached with another conductive element (12, 12') made of metal for establishing electrical connection with an external circuit (see FIGS. 13, 14.) Through this additional conductive element, electric components mounted on the printed boards 1, 1' can be supplied with drive voltage for example.

The substrates 10, 10' can be respectively connected to the metal terminals 11, 11' by means of re-flow soldering. There is a problem, however, according to this method. Specifically, the arrangement of the printed board shown in FIG. 9 does not render self-alignment of the metal terminal 11 to the substrate 10. As a result, positioning accuracy of the metal terminal 11 is not very good.

The term self-alignment in the re-flow soldering as used herein may be described as follows: Referring now to FIG. 11, a piece of metal 30 is to be fixed to a printed board by re-flow soldering. As shown in the figure, the metal piece 30 is an oblong strip of metal, with two end portions 30a, 30b apart longitudinally from each other. The printed board is formed with deposits of solder 35 at predetermined locations respectively corresponding to the two end portions 30a, 30b. Then the metal piece 30 is lowered on the printed board so that the two end portions 30a, 30b will locate at respective predetermined regions, contacting the deposits of solder. Under this state, the solder 35 is heated to melt, and then cooled to solidify, completing the re-flow soldering. During this process, surface tension will act on the melted solder, displacing the end portions 30a, 30b. As a result, the entire piece of the metal 30 comes under alignment relative to the locations applied with solder 35. This process is referred to as the self-alignment. Once the alignment is made for the metal piece 30, the solder 35 is allowed to cool as mentioned earlier.

According to the connection shown in FIG. 9, only one end portion 11A is soldered. Therefore, there is no self-alignment on the end portion 11B. Further, the connection shown in this figure also has a following problem:

Specifically, as shown in FIG. 12, the substrate 10 can be obtained from a single master substrate 3, by forming a regular pattern of the substrate 10, and then separating individual substrates 10 from this master substrate 3. As will be easily understood, the single master substrate 3 should preferably yield as many individual substrates 10 as possible for reasons of manufacturing cost. Each substrate 10 is soldered with the metal terminal 11 before the substrate is separated from the master substrate 3. For this reason, the substrate 10 before separation must be spaced sufficiently away from each other to allow for a projected portion of the metal terminal 11. As a result, yield from the master substrate 3 must be sacrificed.

According to the connection shown in FIG. 10, the entire back surface of the metal terminal 11' is soldered to the substrate 10'. Thus, the metal terminal 11' will self-align in the re-flow soldering. In addition, the metal terminal 11' does not project out of the substrate 10'. Therefore, a single master substrate can yield an efficient number of the printed board 1'. However, even in the arrangement shown in FIG. 10, there is a problem in which the metal terminal 1' is dislocated off the alignment as described below:

As already mentioned, in actual use of the printed boards 1, 1', the metal terminals 11, 11' are respectively attached with conductive elements 12, 12'. The attachment is achieved usually by spot welding. The spot welding is performed as follows: Referring first to FIG. 13, the metal terminal 11 and the conductive element 12 are contacted to each other, then pinched and pressed by a pair of positive and negative terminals 2A, 2B. Under this state, an electric current is passed between the pair of terminals for heating a portion of intended junction. The heating will weld the members 11, 12 together.

Now, in the printed board 1' shown in FIG. 10, the pair of metal terminal 11' and the conductive element 12' cannot be pinched by the electric terminals 2A, 2B. Alternatively, therefore, the metal terminal 11' is overlapped to an end portion of the conductive element 12' as shown in FIG. 14, and the upper face of the end portion is pressed by the pair of electric terminals 2A, 2B. Under this state, an electric current is passed between the pair of terminals for welding a portion of intended junction. The problem is that part of the generated heat is conducted through the bottom face of the metal terminal 11' to the substrate 10', melting the solder between the substrate 10' and the metal terminal 11', allowing the metal terminal 11 to be dislocated off the alignment.

The present invention is made under such circumstances, and it is therefore an object of the present invention to provide accurate soldering of the metal terminal to the substrate. Another object of the present invention is to provide connection of the conductive element to the aligned metal terminal, without causing the metal terminal to be dislocated off the alignment. Still another object of the present invention is to provide an arrangement for compactly attaching a conductive element to the metal terminal.

DISCLOSURE OF THE INVENTION

According to a first aspect of the present invention, there is provided a printed board comprising an insulating substrate, and at least one metal terminal. The substrate has at least one opening penetrating the substrate. The metal terminal is fixed to the substrate so as to bridge the opening.

According to the above arrangement, a bottom face of the metal terminal, which is the surface fixed to the substrate, is exposed at the opening. Therefore, it becomes possible to advantageously perform the spot welding for connecting the metal terminal to the conductive element for electrical connection to an external circuit. Specifically, it becomes possible to pinch the metal terminal and the conductive element vertically by the pair of positive and negative spot welding terminals. Under this state, an electric current is passed between the pair of terminals to generate Joule heat for welding together the conductive element and the metal terminal.

The metal terminal may be an oblong strip, and may have a first end portion and a second end portion longitudinally away from each other. By performing the re-flow soldering for fixing the metal terminal to the substrate at respective first and second end portions, the self-alignment of the metal terminal is advantageously rendered. The opening may be a cutout formed at an edge portion of the substrate, or may be a through-hole formed on the substrate away from the edge portion.

According to a second aspect of the present invention, there is provided a method for making a printed board comprising an insulating substrate and at least one metal terminal. This method includes steps of forming at least one opening in the substrate, forming a plurality of conductive pads on the printed board to flank the opening, applying solder paste to each of the conductive pads, lowering the metal terminal on a pair of the conductive pads so that the metal terminal bridges the opening, heating to melt the solder paste, and then cooling the solder paste.

According to the above method, the metal terminal is lowered on the substrate so that the metal terminal bridges the opening. According to this arrangement, the metal terminal may not be projected out of the substrate for connection to the additional conductive element. Thus, when a plurality of substrates is manufactured simultaneously from a single master substrate, the substrates can be spaced from each other at a smaller interval, which means a larger number of substrates can be manufactured from the single master substrates.

Preferably, the conductive pads should be separated from each other, and the solder paste should be applied individually for each conductive pad. This enhances the self alignment of the metal terminals.

According to a third aspect of the present invention, a printed board made by the above method is provided.

According to a fourth aspect of the present invention, there is provided a connecting arrangement of the conductive element to the printed board. The conductive element is connected to the metal terminal at the opening. Preferably, the metal terminal has a bottom surface facing the opening, and the conductive element is connected to the bottom surface between the first and second end portions. This arrangement prohibits the conductive element from disadvantageously adding thickness to the printed board, contributing to a smaller size and lighter weight of a final electric product which uses the printed board. It should be noted here that the conductive element may be a piece of wire having a circular section.

Other features and advantages of the present invention will become clearer from the detailed description made hereafter referring to the attached drawings.

BEST MODE FOR CARRYING OUT THE INVENTION

An embodiment of the present invention will be described in specific details, referring to the accompanying drawings.

Figure 1:
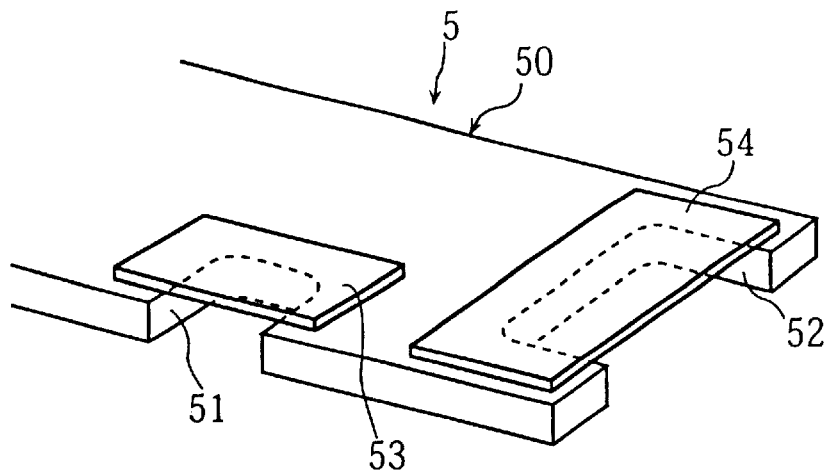
FIG. 1 is a perspective view of a printed board based on the present invention.

FIG. 1 shows a printed board 5 based on the present invention. This printed board comprises a rectangular substrate made of an insulating material such as an epoxy resin, and two metal terminals 53, 54. The printed board 5 has an upper surface formed with an unillustrated wiring pattern of a predetermined design. The substrate 50 has a side portion formed with a cutout 51, and an end portion formed with a cutout 52. The metal terminals 53, 54 are respectively soldered to bridge the cutouts 51, 52.

Figure 3:
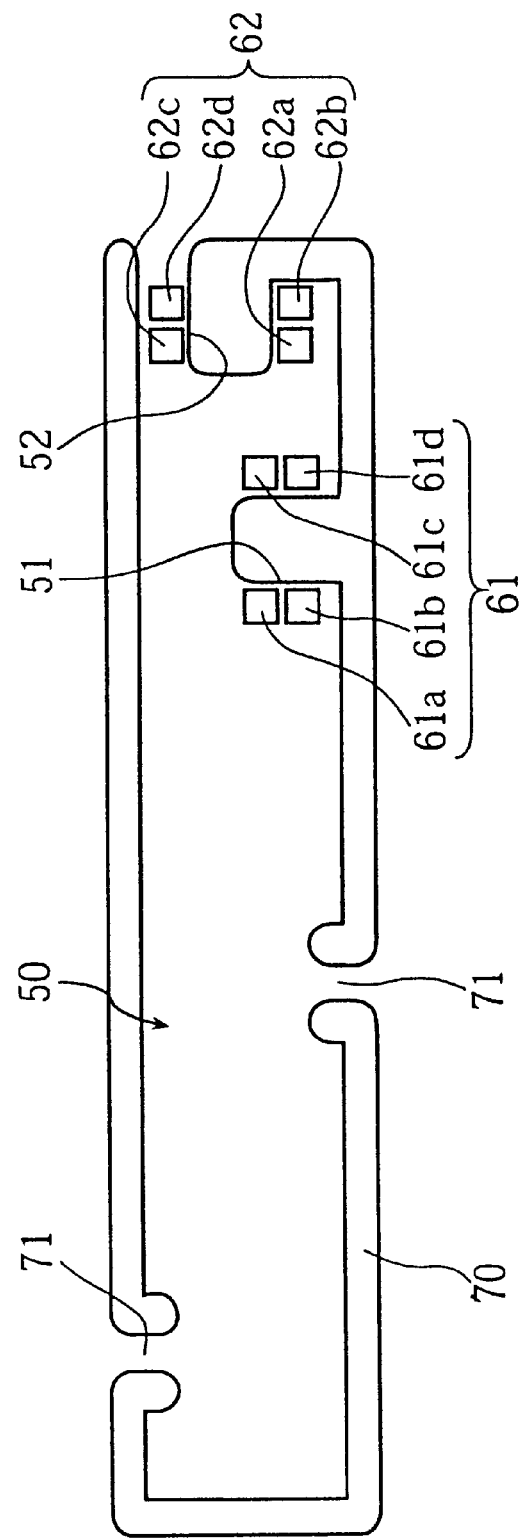
FIG. 3 is an enlarged plan view of the substrate.

FIG. 3 is a plan view showing the substrate 50 when the metal terminals 53, 54 are not mounted. A plurality of conductive pads 61 is formed adjacent to the cutout 51. The pads 61 includes four conductive pads 61a, 61b, 61c and 61d. The conductive pads 61a and 61b oppose the conductive pads 61c and 61d respectively, flanking the cutout 51. Likewise, a plurality of conductive pads 62 is formed adjacent to the cutout 52. The pads 62 includes four conductive pads 62a, 62b, 62c and 62d. The conductive pads 62a and 62b oppose the conductive pads 62c and 62d respectively, flanking the cutout 52. These pads are electrically connected to the unillustrated wiring pattern.

Figure 4:
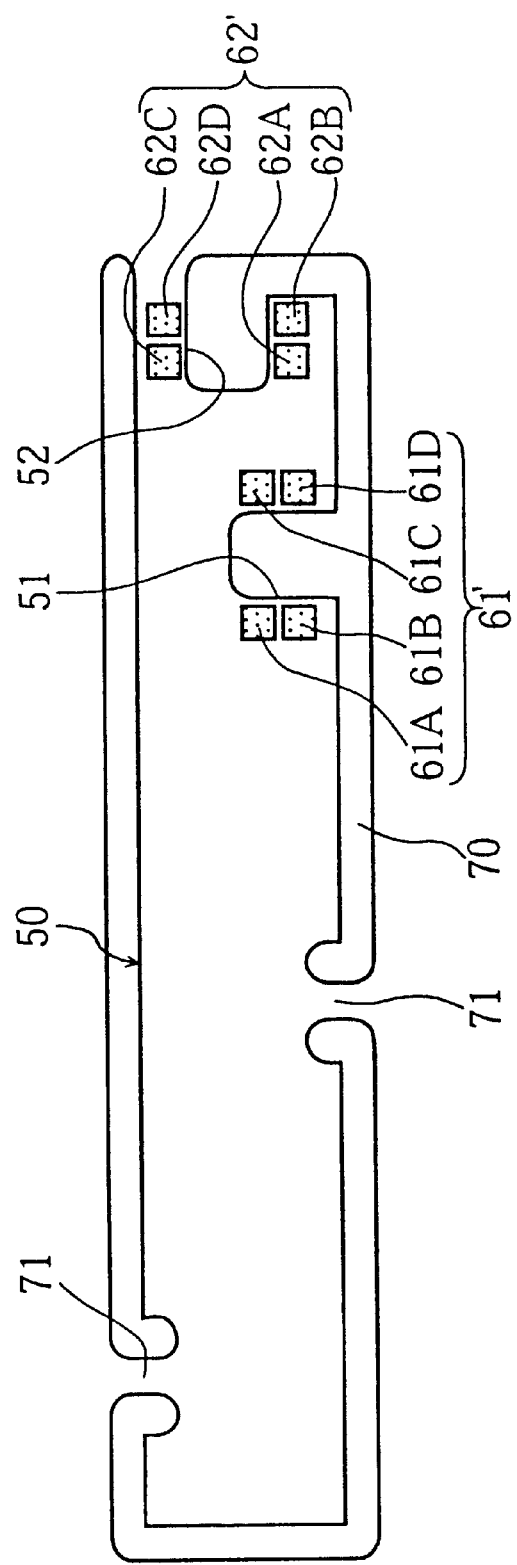
FIG. 4 is a view of the substrate applied with solder paste.

As shown in FIG. 4, the conductive pads 61a through 61d are respectively applied with solder paste 61A through 61D.

The conductive pads 62a through 62d are respectively applied with solder paste 62A through 62D. These deposits of solder paste respectively fix the metal terminals 53, 54 to the substrate 50.

Figure 2:
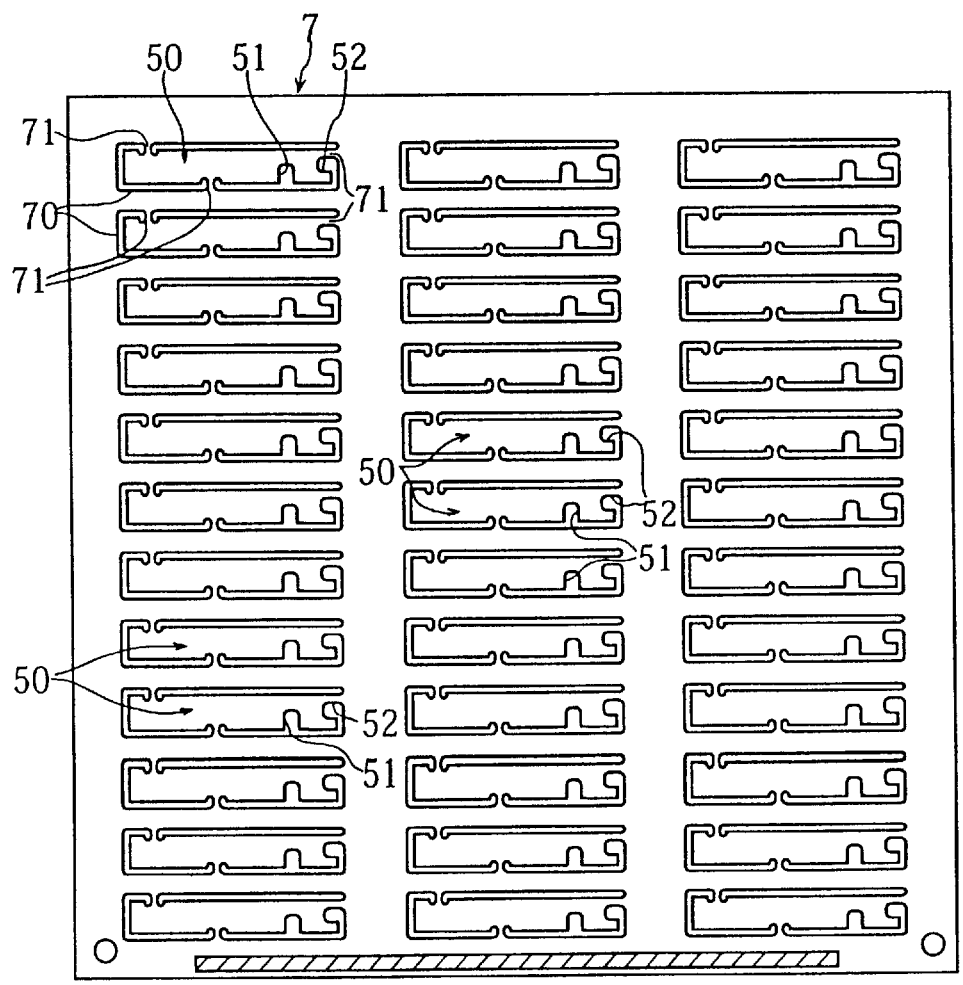
FIG. 2 is a plan view of a master substrate for simultaneous manufacture of a plurality of the substrates.

Now, a method for making the printed board 5 will be described specifically with reference to FIG. 2. As shown in this drawing, a plurality of the substrates 50 are formed on a single master substrate 7. Each substrate 50 has a side portion formed with the cutout 51 and an end portion formed with the cutout 52. Further, each substrate 50 is surrounded by a plurality of grooves 70 penetrating the master substrate 7. Each substrate 50 is supported to the master substrate 7 by a plurality of supporting portions 71. As will be easily understood, each of the supporting portions 71 will be cut later for individually separating the substrates 50. The formation of the plurality of substrates 50 on the master substrate 7 as shown in FIG. 2 may be achieved by punching. Specifically, a flat sheet of substrate made of epoxy resin for example may be punched into a predetermined pattern.

Next, as shown in FIG. 3, conductive pads 61a–61d, and 62a–62d are formed to flank the cutouts 51, 52 respectively. These conductive pads can be formed simultaneously with other pads (not shown) which are formed for mounting desired electronic components on the substrate 50.

Next, as shown in FIG. 4, conductive pads 61a–61d, and 62a–62d are respectively applied with solder paste 61' (61A, 61B, 61C, 61D) and 62' (62A, 62B, 62C, 62D). The deposits of solder paste 61', 62' can be formed on respective conductive pads by a screen-mask printing method.

Figure 5:
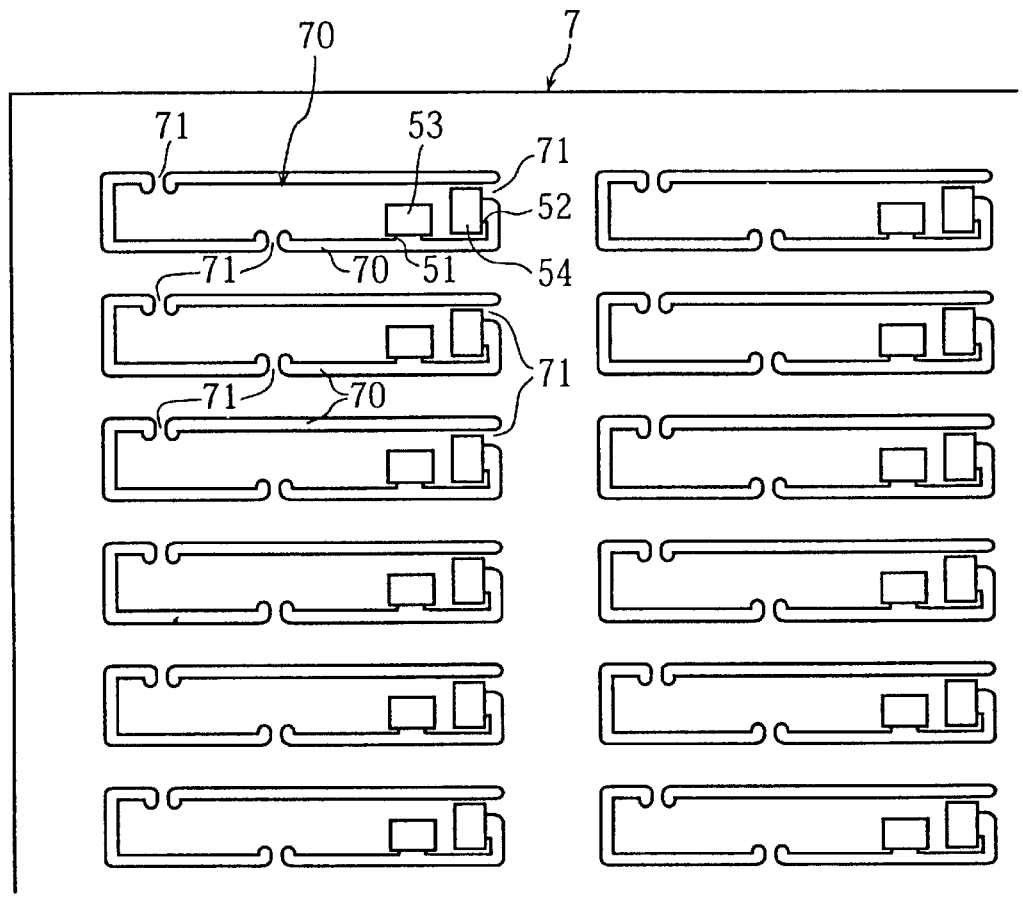
FIG. 5 is a plan view of the master substrate showing the substrates each mounted with a metal terminal.

After the above operations are complete, as shown in FIG. 5, the metal terminals 53, 54 made of nickel for example are lowered so that two opposite end portions of respective metal terminals cover corresponding deposits of the solder paste 61', 62' on each substrate 50. As a result, the metal terminals respectively bridge the cutouts 51 and 52. These operations an be performed by a conventional chip mounter commonly used for mounting chip components on the substrate 50.

The substrate 50 placed with the metal terminals 53, 54 is then moved into a furnace (not shown) and heated for re-flow soldering. During this process the solder paste 61A–62D will melt. As described earlier, these deposits of solder paste are disposed to predetermined locations correspondingly respectively to the two opposite end portions of the metal terminals 53, 54. Thus, the metal terminals 53, 54 are positioned appropriately through the self-alignment. When the solder paste is then cooled to cure, the metal terminals 53, 54 are fixed accurately to respective predetermined positions on the substrate 50.

Finally, by cutting the support portions 71 of each substrate 50, the individual printed board 5 is obtained.

Figure 6:
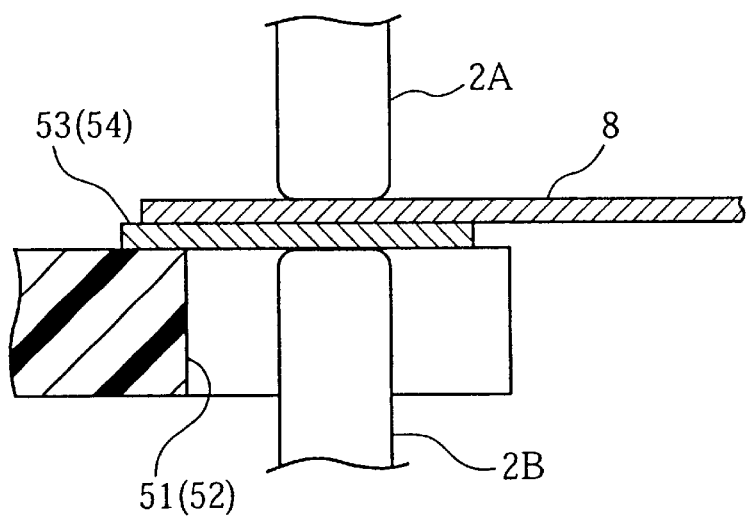
FIG. 6 is a sectional view showing a conductive element spot-welded to the metal terminal.

According to the printed board 5 obtained by the above method, the metal terminals 53, 54 fixed to the substrate respectively bridge the cutouts 51, 52. Thus, when the metal terminal 53 (or 54) is spot-welded to the conductive element 8, as shown in FIG. 6, the metal terminal 53 (or 54) and the conductive element 8 can be pinched together by the electric terminals 2A, 2B at the cutout 51 (or 52). As a result, when an electric current is passed between the pair of terminals 2A, 2B, the generated heat will not conduct as far as the solder between the substrate 50 and the-metal terminal 53 (or 54), and therefore will not cause the problem of re-melted solder.

Further, according to the present arrangement, there is no need for the metal terminals 53, 54 to be projected out of the substrate 50. Thus, a plurality of the substrates 50 can be formed more closely to each other on a single piece of the master substrate 7. Therefore, a greater number of printed board 5 can be produced from the master substrate 7 for reduced cost.

According to FIG. 6, the conductive element 8 is connected on the upper face of the metal terminal 53 (or 54). However, the conductive element 8 may be connected to the bottom face of the metal terminal, so that the conductive element come inside of the cutout 51 (or 52). Such an arrangement does not add any thickness of the conductive element 8 to the vertical dimension of the substrate, and therefore the printed board can be more compact.

Figure 7:
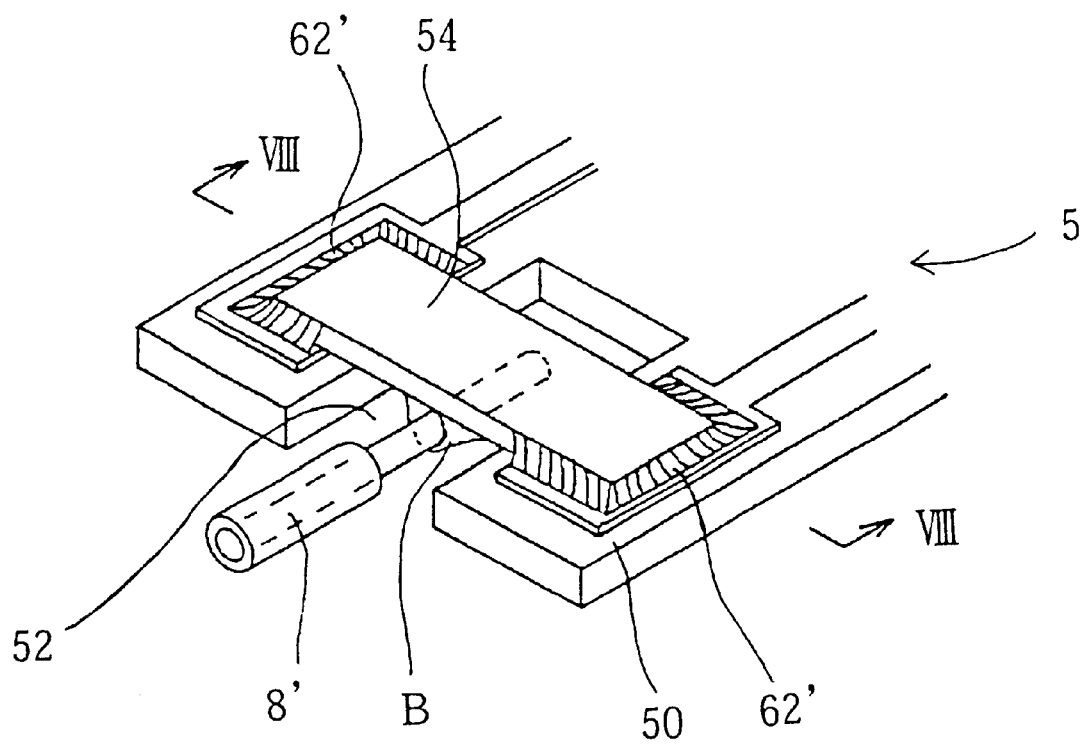
FIG. 7 is a perspective view showing a piece of wire as the conductive element spot-welded to a bottom face of the metal terminal.
Figure 8:
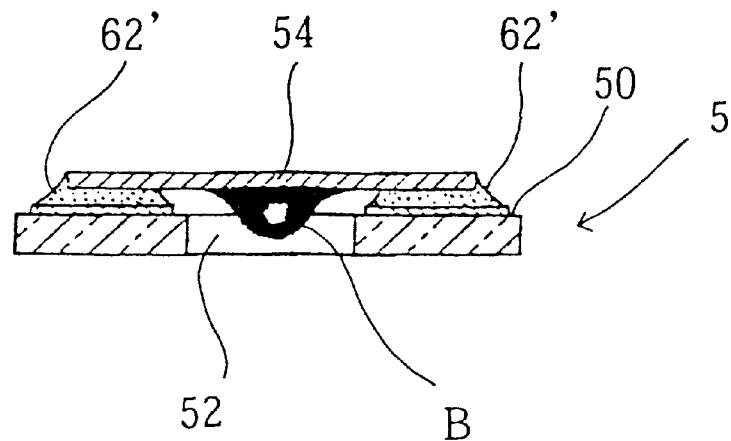
FIG. 8 is a sectional view taken on lines VIII—VIII in FIG. 7.
Figure 9:
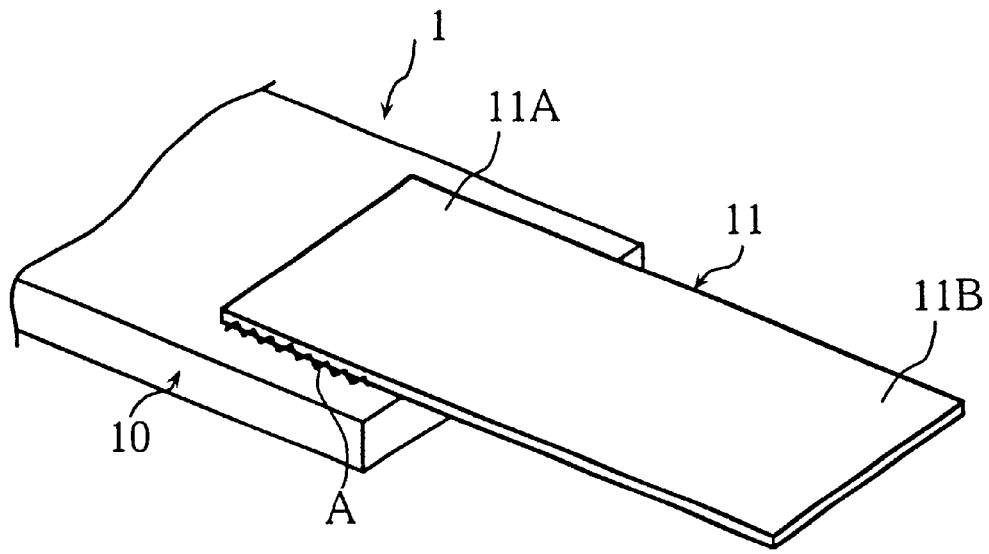
FIG. 9 is a perspective view showing a prior art arrangement for the connection of the metal terminal to the substrate.
Figure 10:
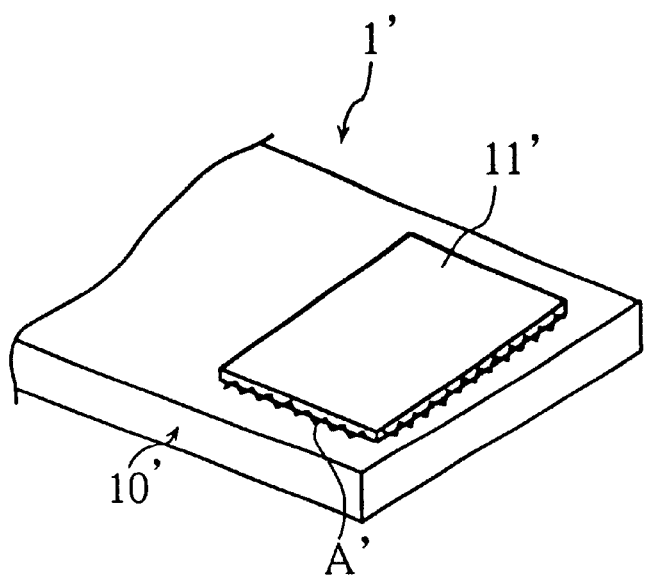
FIG. 10 is a perspective view showing another prior art arrangement for the connection.
Figure 11:
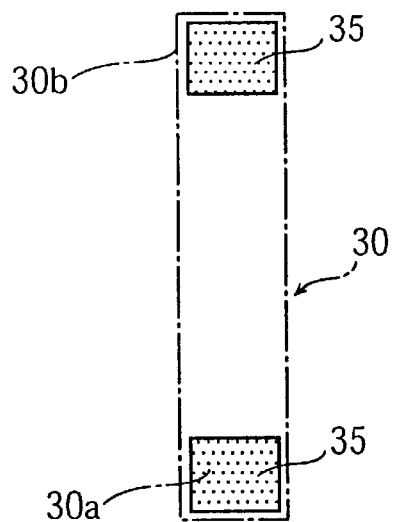
FIG. 11 is an illustrative representation of the self-alignment.
Figure 12:
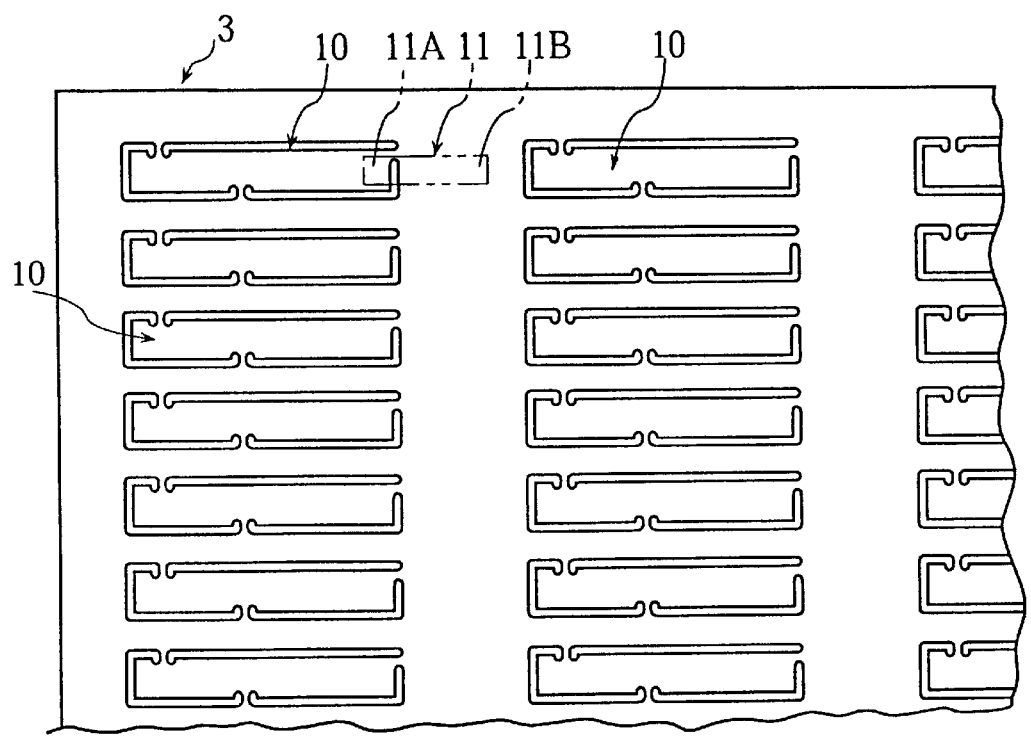
FIG. 12 is a plan view showing a master substrate for manufacturing the printed board shown in FIG. 9.
Figure 13:
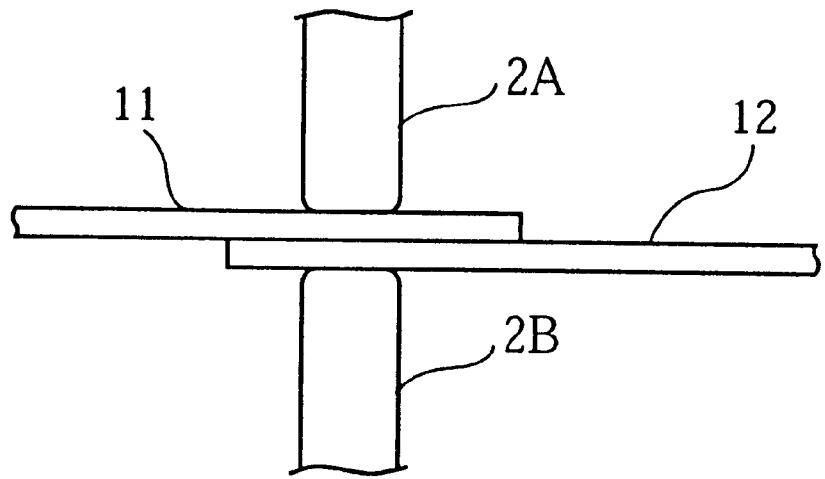
FIG. 13 is a side view showing a conductive element being spot-welded to the metal terminal in FIG. 9.
Figure 14:
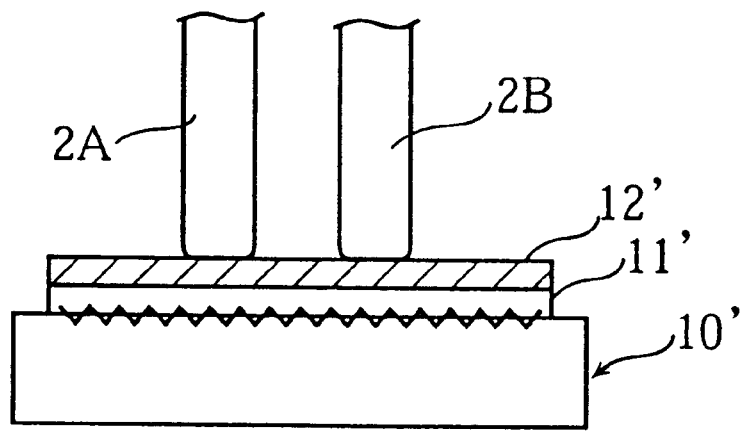
FIG. 14 is a side view showing a conductive element being spot-welded to the metal terminal in FIG. 10.

Further, as shown in FIG. 7, the conductive element may be a piece of wire 8', which may be fixed to the metal terminal 54 by solder (B). Again in this case, the soldering may advantageously made to the bottom face of the metal terminal, i.e. inside of the cutout 52. This avoids an inconvenient increase in the thickness of the substrate 50, and therefore the printed board can be compact. (See FIG. 8.) Note should be made here that the soldered portion is away from the solder 62 which fixes the metal terminal 54 to the substrate 50. Thus, there is no such problem that the soldering operation to the conductive wire may cause the solder 62', to re-melt, causing the metal terminal 54 to be dislocated off the alignment.

The embodiment of the present invention has been described thus far. However, the scope of the present invention is not limited to these. For example, the substrate 50 may be formed with cutouts 51, 52 in many other shapes and at many other locations. The number of cutouts may be only 1 or more than 3. Further, instead of the cutouts 51, 52, penetrating holes may be formed at appropriate locations on the substrate 50, so that the metal terminals 53, 54 may be soldered to bridge these through-holes. Still further, locations and the number of the deposits of solder 61A–62D may be changed freely. The location and number of supporting portions to be formed in the master substrate 7 are not limited by the present embodiment, either.

What is claimed is:

1. A printed board comprising;
   an insulating substrate; and
   at least one metal terminal plate;
   wherein the substrate includes at least one opening penetrating the substrate, said at least one metal terminal plate being fixed to the substrate so as to bridge said at least one opening;
   wherein said at least one metal terminal plate has a first end portion and a second end portion opposite to the first end portion;
   wherein the substrate is formed with a plurality of first conductive pads which are spaced from each other in a first direction and soldered to the same first end portion of said at least one metal terminal plate; and
   wherein the substrate is also formed with a plurality of second conductive pads which are spaced from each other in said first direction and soldered to the same second end portion of said at least one metal terminal plate, the plurality of the second conductive pads being spaced from the plurality of first conductive pads in a second direction transverse to said first direction across said at least one opening.

2. The printed board according to claim 1, wherein said at least one opening is a cutout formed at an edge portion of the substrate.

3. A connecting arrangement for the printed board according to claim 1, wherein a conductive element is connected to said at least one metal terminal plate at said at least one opening.

4. The connecting arrangement according to claim 3, wherein said at least one metal terminal plate has a bottom surface facing said at least one opening, the conductive element being connected to the bottom surface between the first and the second end portions.

5. The connecting arrangement according to claim 4, wherein the conductive element is a piece of wire having a generally circular section.

6. A method for making a printed board including an insulating substrate and at least one metal terminal plate, comprising the steps of;

forming at least one opening in the substrate, forming a plurality of first conductive pads on the substrate to flank said at least one opening at a side thereof, the first conductive pads being spaced from each other in a first direction, forming a plurality of second conductive pads on the substrate to flank said at least one opening at an opposite side thereof, the second conductive pads being spaced from each other in said first direction, the plurality of the second conductive pads being spaced from the plurality of first conductive pads in a second direction transverse to said first direction across said at least one opening, applying solder paste individually to each of the conductive pads, lowering said at least one metal terminal plate so that said at least one metal terminal plate bridges said at least one opening, the solder paste at the plurality of first conductive pads coming into contact with a same first end portion of said at least one metal terminal plate, the solder paste at the plurality of second conductive pads coming into contact with a same second end portion of said at least one metal terminal plate opposite to the first end portion, heating the solder paste to melt, and cooling the solder paste.

* * * * *